United States Patent
Chen et al.

(10) Patent No.: US 11,158,360 B1
(45) Date of Patent: Oct. 26, 2021

(54) MEMORY DEVICE WITH VOLTAGE BOOSTING CIRCUIT

(71) Applicant: DigWise Technology Corporation, LTD, Hsinchu County (TW)

(72) Inventors: Shih-Hao Chen, Hsinchu County (TW); Wen-Pin Hsieh, Hsinchu County (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 0 days.

(21) Appl. No.: 17/070,931

(22) Filed: Oct. 15, 2020

(30) Foreign Application Priority Data

Sep. 21, 2020 (TW) .................................. 109132509

(51) Int. Cl.
*G11C 8/08* (2006.01)
*G11C 11/412* (2006.01)
*G11C 11/418* (2006.01)
*G11C 5/14* (2006.01)

(52) U.S. Cl.
CPC ................ *G11C 8/08* (2013.01); *G11C 5/147* (2013.01); *G11C 11/412* (2013.01); *G11C 11/418* (2013.01)

(58) Field of Classification Search
CPC ......... G11C 8/08; G11C 5/147; G11C 11/418; G11C 11/412
See application file for complete search history.

(56) References Cited

U.S. PATENT DOCUMENTS

| 5,847,597 A * | 12/1998 | Ooishi | G11C 11/4074 327/543 |
| 6,229,740 B1 * | 5/2001 | Ogura | G11C 5/143 327/390 |
| 7,440,354 B2 | 10/2008 | Liston et al. | |
| 7,742,346 B2 * | 6/2010 | Chen | G11C 5/145 365/189.09 |
| 10,483,975 B1 * | 11/2019 | Wu | H03K 17/687 |
| 2004/0130931 A1 * | 7/2004 | Izutsu | G11C 11/417 365/154 |
| 2005/0105344 A1 | 5/2005 | Chung | |
| 2013/0215701 A1 * | 8/2013 | Venkata | G11C 8/14 365/227 |
| 2017/0178751 A1 * | 6/2017 | Choi | G11C 29/50 |

FOREIGN PATENT DOCUMENTS

TW 201145280 12/2011

* cited by examiner

*Primary Examiner* — Khamdan N. Alrobaie
(74) *Attorney, Agent, or Firm* — JCIPRNET

(57) ABSTRACT

A memory device including a voltage boosting circuit, a switching circuit and a word line driving circuit is provided. The voltage boosting circuit is activated in a sleep mode. The voltage boosting circuit, based on an activation signal, performs a voltage boosting operation on a power voltage of a power voltage rail to generate a boosting voltage and transmit the boosting voltage to a control voltage rail. The switching circuit is turned on or cut-off according to a first mode selection signal. The word line driving circuit generates a plurality of word line signals according to the boosting voltage in the sleep mode; in addition, the word line driving circuit generates the word line signals according to the power voltage in a normal mode.

10 Claims, 9 Drawing Sheets

MEMORY DEVICE WITH VOLTAGE BOOSTING CIRCUIT

CROSS-REFERENCE TO RELATED APPLICATION

This application claims the priority benefit of Taiwan application no. 109132509, filed on Sep. 21, 2020. The entirety of the above-mentioned patent application is hereby incorporated by reference herein and made a part of this specification.

TECHNICAL FIELD

The invention relates to a memory device, and more particularly, to a voltage supply mechanism of a memory device in a sleep mode.

BACKGROUND

Static random access memory (SRAM) is a commonly used storage medium in electronic devices. In application, as long as a power voltage can be continuously supplied to SRAM, data held in SRAM can be maintained without loss.

Nowadays, energy saving and carbon reduction are an important issue for the electronic devices. Therefore, power consumption requirement of SRAM also needs to be effectively reduced. In the prior art, power consumption of the electronic device is often reduced by reducing the power voltage in the sleep mode. However, when the power voltage drops too low, the data stored in SRAM may be lost. Even if the data stored in SRAM is not missing, SRAM is still unable to perform effective access operations with the power voltage being too low and results in a reduced efficiency in use.

SUMMARY

The invention provides a memory device capable of supplying an appropriate voltage in the sleep mode to maintain the operation of the memory device.

A memory device of the invention includes a voltage boosting circuit, a switching circuit and a word line driving circuit. The voltage boosting circuit is coupled to a power voltage rail. The voltage boosting circuit is activated in a sleep mode. The voltage boosting circuit, based on an activation signal, performs a voltage boosting operation on a power voltage of a power voltage rail to generate a boosting voltage and transmit the boosting voltage to a control voltage rail. The switching circuit is coupled between the power voltage rail and the control voltage rail and is turned on or cut-off according to a first mode selection signal. The word line driving circuit is coupled to the control voltage rail. The word line driving circuit generates a plurality of word line signals according to the boosting voltage in the sleep mode; in addition, the word line driving circuit generates the word line signals according to the power voltage in a normal mode.

Based on the above, the memory device of the invention generates the boosting voltage by boosting the received power voltage in the sleep mode. The boosting voltage is provided to the word line driving circuit through the control voltage rail so the word line driving circuit can still effectively generate the word line signals in the sleep mode to maintain a normal access of the memory device.

DETAILED DESCRIPTION

Figure 1:
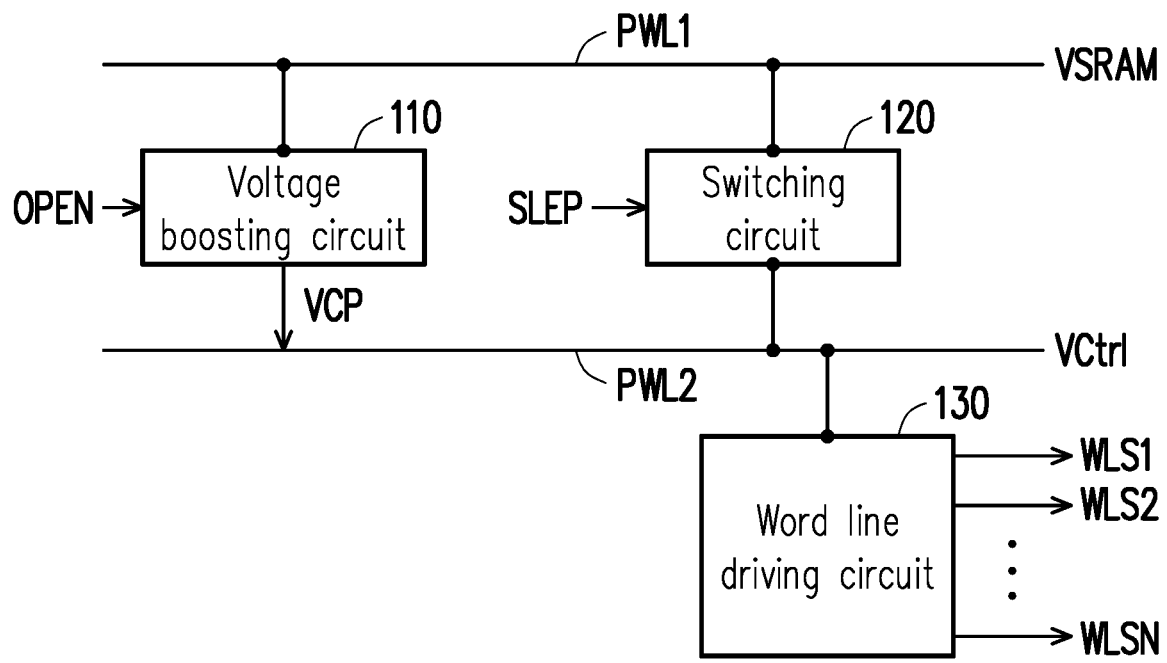
FIG. 1 is a schematic diagram illustrating a memory device in an embodiment of the invention.

Referring to FIG. 1, FIG. 1 is a schematic diagram illustrating a memory device in an embodiment of the invention. A memory device 100 includes a voltage boosting circuit 110, a switching circuit 120 and a word line driving circuit 130. The voltage boosting circuit 110 is coupled to a power voltage rail PWL1. The voltage boosting circuit 110 can be activated in a sleep mode. When the voltage boosting circuit 110 is activated, based on an activation signal OPEN, the voltage boosting circuit 110 can perform a voltage boosting operation on a power voltage VSRAM of the power voltage rail PWL1 to generate a boosting voltage VCP. The voltage boosting circuit 110 then transmits the boosting voltage VCP to a control voltage rail PWL2 as a control voltage VCtrl of the control voltage rail PWL2. Here, the memory device 100 is a static random access memory device.

The switching circuit 120 is coupled between the power voltage rail PWL1 and the control voltage rail PWL2 and is turned on or cut-off according to a mode selection signal SLEP. In this embodiment, when the mode selection signal SLEP indicates that the memory device 100 enters the sleep mode, the switching circuit 120 is cut-off so that the power voltage rail PWL1 and the control voltage rail PWL2 are electrically isolated from each other. In contrast, when the mode selection signal SLEP indicates that the memory device 100 enters a normal mode, the switching circuit 120 is turned on so that the power voltage rail PWL1 and the control voltage rail PWL2 are electrically connected to each other.

When the memory device 100 is in the normal mode, the switching circuit 120 electrically connects the power voltage rail PWL1 and the control voltage rail PWL2 to each other. In this state, the power voltage VSRAM of the power voltage rail PWL1 can be transmitted to the control voltage rail PWL2 through the switching circuit 120 so that the control voltage VCtrl is equal to the power voltage VSRAM. In contrast, when the memory device 100 is in the sleep mode, the switching circuit 120 electrically isolates the power voltage rail PWL1 and the control voltage rail PWL2 from each other. At this time, the voltage boosting circuit 110 is activated, and performs the voltage boosting operation on the power voltage VSRAM to generate the boosting voltage VCP. At this time, the voltage boosting circuit 110 can provide the boosting voltage VCP to the control voltage rail PWL2 as the control voltage VCtrl.

On the other hand, the word line driving circuit 130 is coupled to the control voltage rail PWL2, receives the control voltage VCtrl through the control voltage rail PWL2, and generates word line signals WLS1 to WLSN according to the control voltage VCtrl. The word line signals WLS1 to WLSN are transmitted to a plurality of word lines in the memory device 100. According to the foregoing description, when the memory device 100 is in the normal mode, the word line signals WLS1 to WLSN are generated according to the power voltage VSRAM; in contrast, when the memory device 100 is in the sleep mode, the word line signals WLS1 to WLSN are generated according to the boosting voltage VCP.

It is worth noting that the power voltage VSRAM in the sleep mode can be reduced to be lower than the power voltage VSRAM in the normal mode to reduce power consumption. At the same time, in order to maintain the memory device 100 to perform normal access operations, the voltage boosting circuit 110 can generate a sufficiently high charging voltage VCP according to the power voltage VSRAM, and provide the charging voltage VCP as the control voltage VCtrl. In this way, in the sleep mode, the word line driving circuit 130 can still generate the word line signals WLS1 to WLSN with a sufficiently high voltage, and maintain the normal access operation of the memory device 100.

In this embodiment, the voltage boosting circuit 110 can be any form of charge pump circuit without particular limitation.

Figure 2A:
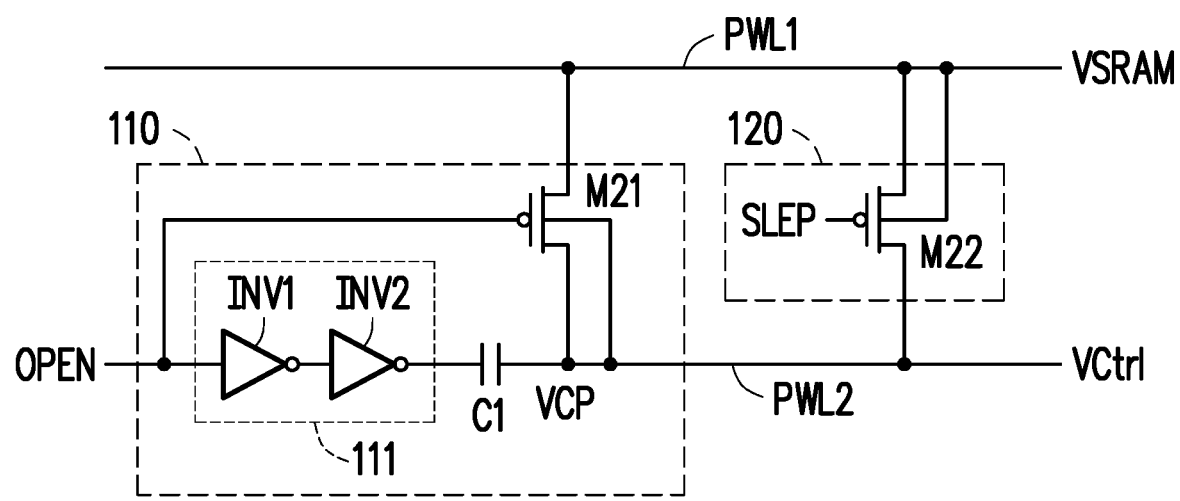
FIG. 2A is a schematic diagram illustrating an implementation of a voltage boosting circuit and a switching circuit in the embodiment of FIG. 1.
Figure 2B:
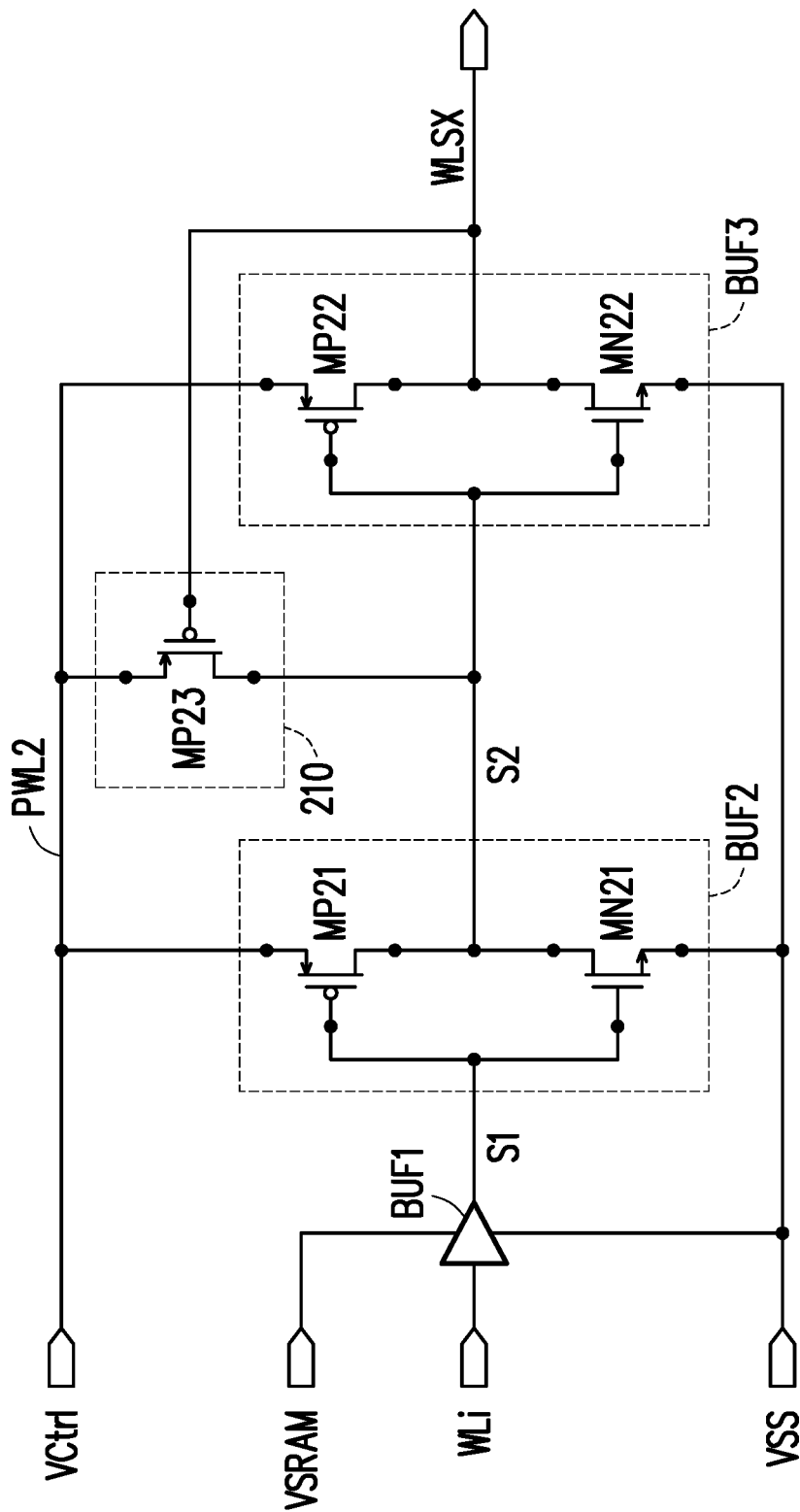
FIG. 2B is a schematic diagram illustrating a word line driving circuit of the embodiment in FIG. 1.

Referring to FIG. 2A and FIG. 2B, FIG. 2A is a schematic diagram illustrating an implementation of a voltage boosting circuit and a switching circuit in the embodiment of FIG. 1, and FIG. 2B is a schematic diagram illustrating a word line driving circuit of the embodiment in FIG. 1.

Referring to FIG. 2A first, the voltage boosting circuit 110 includes a buffer 111, a capacitor C1, and a switch formed by a transistor M21. The buffer 111 is composed of a plurality of inverters INV1 and INV2 connected in series. The inverter INV1 of the first stage receives the activation signal OPEN, and an output terminal of the inverter INV2 of the last stage is coupled to a first terminal of the capacitor C1. In addition, a second terminal of the capacitor C1 is coupled to one terminal of the transistor M21 and is coupled to the control voltage rail PWL2. Another terminal of the transistor M21 is coupled to the power voltage rail PWL1. The transistor M21 has a control terminal receiving the activation signal OPEN and is turned on or cut-off according to the activation signal OPEN. In this embodiment, the transistor M21 is a P-type transistor.

As operation details of the voltage boosting circuit 110, in the normal mode, the activation signal OPEN may be a logic low level. At this time, the transistor M21 is turned on and electrically connects the power voltage rail PWL1 and the control voltage rail PWL2 to each other. At this time, the control voltage VCtrl is equal to the power voltage VSRAM. Further, at this time, the first terminal of the capacitor C1 receives the logic low level, and the second terminal of the capacitor C1 receives the power voltage VSRAM.

When the sleep mode is entered, the activation signal OPEN is switched to a logic high level. The voltage of the first terminal of the capacitor C1 is changed to the logic high level, and the transistor M21 is correspondingly cut-off. At the same time, through the charge pump effect of the capacitor C1, the capacitor C1 can boost the generated charging voltage VCP and accordingly generate the control voltage VCtrl.

On the other hand, the switching circuit 120 is composed of a transistor M22. The transistor M22 is a P-type transistor. In this embodiment, the transistor M22 is controlled by the mode selection signal SLEP and is turned on or cut-off according to the mode selection signal SLEP. In the normal mode, the transistor M22 can be turned on according to the mode selection signal SLEP at logic low voltage to provide the power voltage VSRAM of the power voltage rail PWL1 to the control voltage rail PWL2 as the control voltage VCtrl. In the sleep mode, the transistor M22 can be cut-off according to the mode selection signal SLEP at logic high voltage. In this way, the power voltage rail PWL1 and the control voltage rail PWL2 are electrically isolated. At this time, the voltage boosting circuit 110 provides the boosting voltage VCP to the control voltage rail PWL2 as the control voltage VCtrl. Accordingly, the word line driving circuit can generate effective word line signals.

Incidentally, in this embodiment, a base of the transistor M21 is coupled to the control voltage rail PWL2, and a base of the transistor M22 is coupled to the power voltage rail PWL1.

In FIG. 2B, the word line driving circuit 120 includes buffers BUF1 to BUF3 and a pull-up circuit 210. The buffer BUF1 is a non-inverting buffer. The buffer BUF1 receives the power voltage VSRAM as an operating power and receives a word line control signal WLi to generate a signal S1 according to the word line control signal WLi. The buffer BUF2 and the buffer BUF3 are coupled in series. The buffer BUF2 and the buffer BUF3 may both be inverting buffers (inverters). Among them, the buffer BUF2 generates a signal S2 according to the signal S1, and the buffer BUF3 generates a word line driving signal WLSx according to the signal S2.

It should be noted that the buffers BUF2 and BUF3 both receive the control voltage VCtrl of the control voltage rail PWL2 as an operating power. In the normal mode, the control voltage VCtrl is equal to the power voltage VSRAM; in the sleep mode, the control voltage VCtrl may be equal to the boosting voltage VCP generated by boosting the power voltage VSRAM.

The buffer BUF2 includes transistors MP21 and MN21. The transistors MP21 and MN21 are connected in series between the control voltage rail PWL2 and a reference ground terminal VSS. Control terminals of the transistors MP21 and MN21 receive the signal S1, and a mutually-coupled terminal of the transistors MP21 and MN21 generates the signal S2. The buffer BUF3 includes transistors MP22 and MN22. The transistors MP22 and MN22 are connected in series between the control voltage rail PWL2 and the reference ground terminal VSS. Control terminals of the transistors MP22 and MN22 receive the signal S2, and a mutually-coupled terminal of the transistors MP22 and MN22 generates the word line driving signal WLSx.

The pull-up circuit 210 is coupled between the control voltage rail PWL2 and an output terminal of the buffer BUF2. The pull-up circuit 210 includes a transistor MP23. The transistor MP23 is a P-type transistor which has a control terminal receiving the word line driving signal WLSx, and is turned on when the word line driving signal WLSx is at logic low voltage to pull up the signal S2 to the control voltage VCtrl.

It is worth mentioning that the word line driving circuit 120 shown in FIG. 2B is only an example for illustration, and is not used to limit the scope of the invention. In the embodiments of the invention, any word line driving circuit well known to those skilled in the art can be applied to the invention as long as the control voltage VCtrl of the control voltage rail PWL2 can be received as the operating power.

Figure 3:
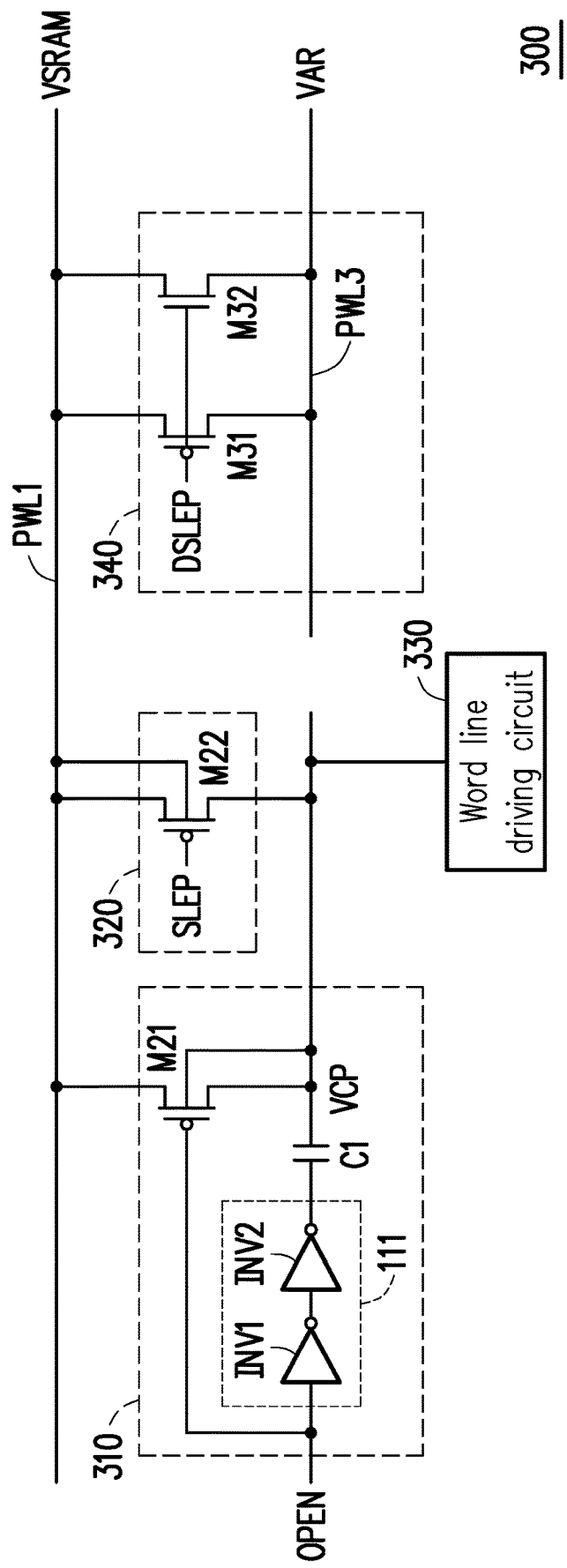
FIG. 3 is a schematic diagram illustrating a memory device according to another embodiment of the invention.

Referring to FIG. 3, FIG. 3 is a schematic diagram illustrating a memory device according to another embodiment of the invention. A memory device 300 includes a voltage boosting circuit 310, a switching circuit 320, a word line driving circuit 330 and an internal voltage adjusting circuit 340. In this embodiment, the operation details of the voltage boosting circuit 310, the switching circuit 320 and the word line driving circuit 330 are similar to those of the voltage boosting circuit 110, the switching circuit 120, and the word line driving circuit 130 in the foregoing embodiment, and are not repeated here. In addition, the internal voltage adjusting circuit 340 is coupled to the power voltage rail PWL1 to receive the power voltage VSRAM of the power voltage rail PWL1 as an operating power. The internal voltage adjusting circuit 340 is further coupled to an internal voltage rail PWL3. The internal voltage adjusting circuit 340 selects whether to reduce the power voltage VSRAM to generate an internal voltage VAR according to another mode selection signal DSLEP. The internal voltage VAR is configured to be provided to a memory cell array in the memory device 300.

In this embodiment, the internal voltage adjusting circuit 340 includes transistors M31 and M32. Among them, the transistor M31 is a P-type transistor, and the transistor M32 is an N-type transistor. The transistors M31 and M32 are coupled in parallel with each other, and are connected between the power voltage rail PWL1 and the internal voltage rail PWL3. Control terminals of the transistor M31 and M32 receive the mode selection signal DSLEP together. The mode selection signal DSLEP is used to indicate whether the memory device 300 enters a deep sleep mode.

In detail, when the memory device 300 does not enter the deep sleep mode, the mode selection signal DSLEP may be at logic low voltage. At this time, the transistor M31 is turned on and the transistor M32 is cut-off. Under such condition, the power voltage rail PWL1 and the internal voltage rail PWL3 are electrically connected to each other, and the power voltage rail PWL1 transmits the power voltage VSRAM to the internal voltage rail PWL3 so that the internal voltage VAR is equal to the power voltage VSRAM.

On the other hand, when the memory device 300 enters the deep sleep mode, the mode selection signal DSLEP may be at logic high voltage. At this time, the transistor M31 is cut-off and the transistor M32 is turned on. Since the transistor M32 is an N-type transistor, the body effect generated on the transistor M32 can make the internal voltage VAR equal to the power voltage VSRAM minus a threshold voltage of the transistor M32, and can reduce the operating power received by the memory cell array to achieve a power saving effect.

In this embodiment, a base terminal of the transistor M31 can be coupled to the power voltage rail PWL1, and a base terminal of the transistor M32 can be coupled to the reference ground terminal.

Figure 4:
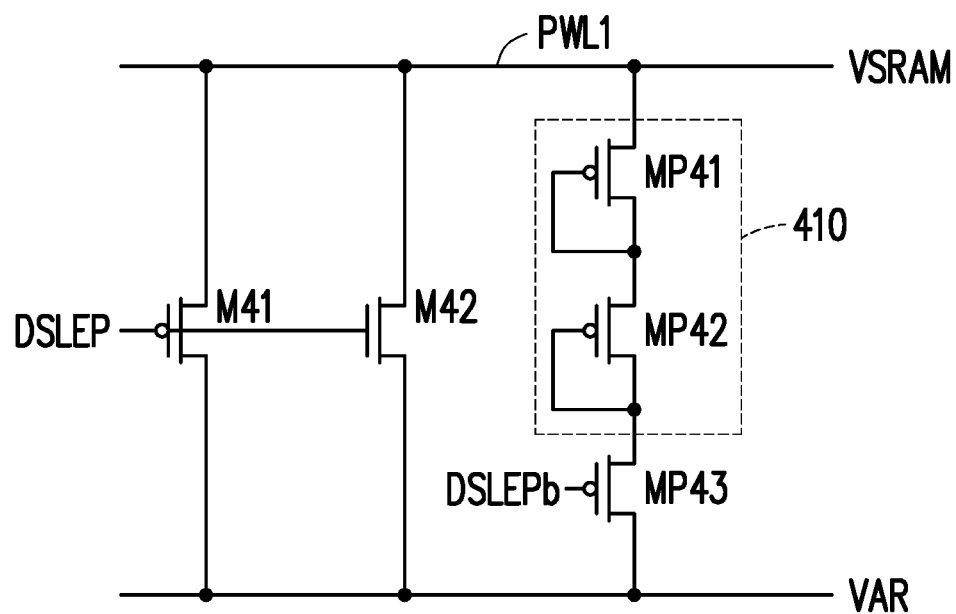
FIG. 4 is a schematic diagram illustrating another implementation of an internal voltage adjusting circuit in a memory device according to an embodiment of the invention.

Referring to FIG. 4, FIG. 4 is a schematic diagram illustrating another implementation of an internal voltage adjusting circuit in a memory device according to an embodiment of the invention. An internal voltage adjusting circuit 400 includes transistors M41 and M42, a diode string 410 and a transistor M43. The transistors M41 and M42 are a P-type transistor and an N-type transistors, respectively. The operation details of the transistors M41 and M42 are the same as those of the transistors M31 and M32 in the embodiment of FIG. 3, and are not repeated here.

On the other hand, the diode string 410 and the transistor M43 are coupled in series between the power voltage rail PWL1 and the internal voltage rail PWL3. The diode string 410 may include one or more diodes, which are sequentially coupled between the power voltage rail PWL1 and the internal voltage rail PWL3 in a forward bias direction. In FIG. 4, the diode string 410 includes the diodes composed of transistors MP41 and MP42. The transistors MP41 and MP42 are both coupled in a diode configuration. Naturally, in other embodiments of the invention, the diodes in the diode string 410 may also be constructed through N-type transistors or generated through the P-N junction in the semiconductor wafer without particular limitation.

In addition, a control terminal of the transistor M43 receives a backward mode selection signal DSLEPb. The backward mode selection signal DSLEPb and the mode selection signal DSLEP are complementary in terms of logic voltage. When the mode selection signal DSLEP is at logic high voltage (the memory device is in a non-deep sleep mode), the transistor M41 is turned on, and the transistors M42 and M43 are cut-off. At this time, the internal voltage VAR is equal to the power voltage VSRAM. When the mode selection signal DSLEP is at logic low voltage (the memory device is in the deep sleep mode), the transistor M41 is cut-off, and the transistors M42 and M43 are turned on. At this time, the body effect provided by the transistor M42 can make the internal voltage VAR equal to the power voltage VSRAM minus a threshold voltage of the transistor M42. The diode string 410 and the transistor M43 can make the internal voltage VAR equal to the power voltage VSRAM minus a breakover voltage of the diode string 410.

It is worth mentioning that in this embodiment, one of the transistor M42 and a series circuit formed by the diode string 410 and the transistor M43 can be selected to be constructed in the internal voltage adjusting circuit 400, or they can be disposed together in the internal voltage adjusting circuit 400.

Incidentally, a coupling sequence of the diode string 410 and the transistor M43 is not particularly limited. Here, as illustrated in FIG. 4, the diode string 410 and the transistor M43 are sequentially connected in series between the power voltage rail PWL1 and the internal voltage rail PWL3. In other embodiments of the invention, the positions of the diode string 410 and the transistor M43 can also be interchanged without specific limitation.

Figure 5:
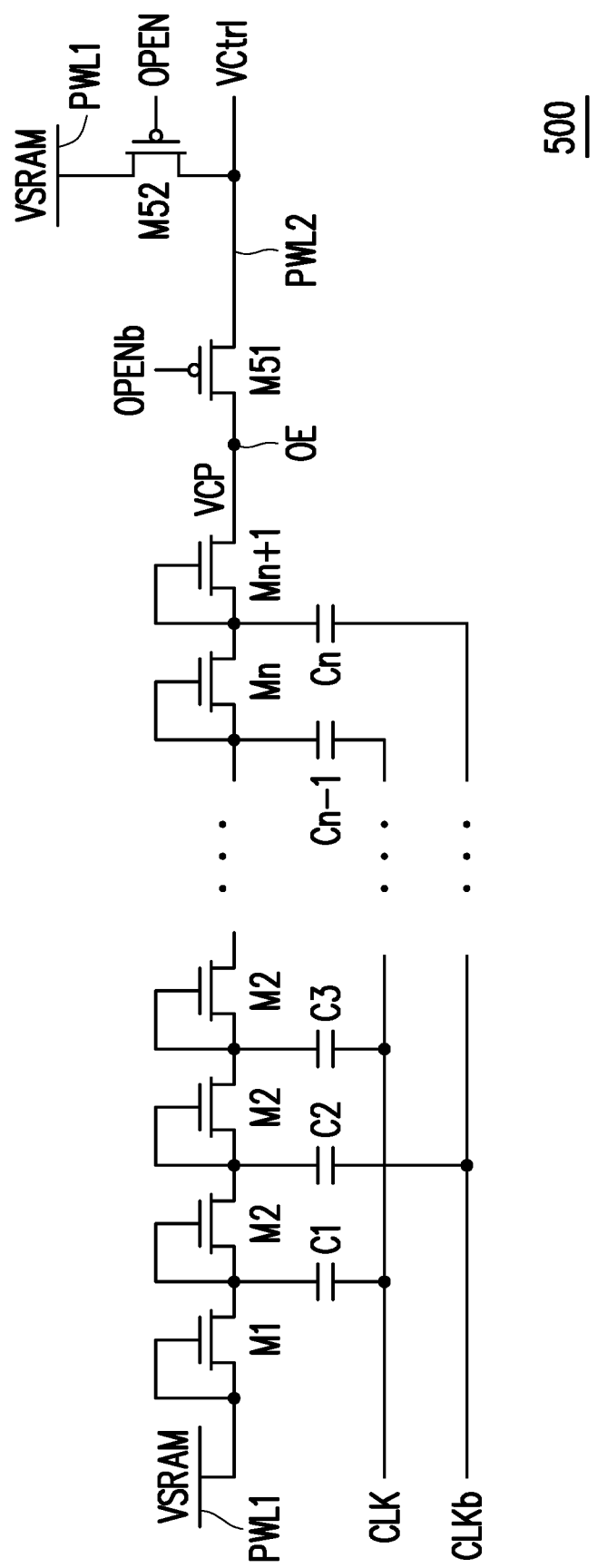
FIG. 5 to FIG. 7 are schematic diagrams respectively illustrating different implementations of a boosting circuit in a memory device of the embodiment of the invention.
Figure 6:
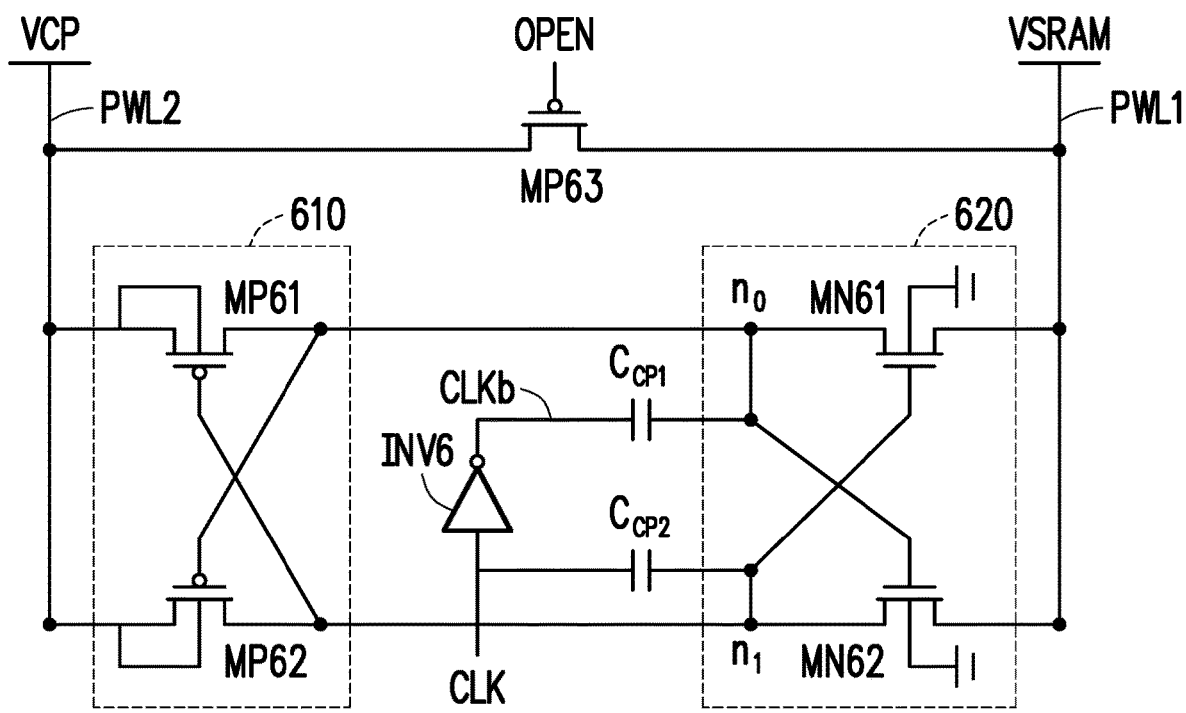
Figure 7:
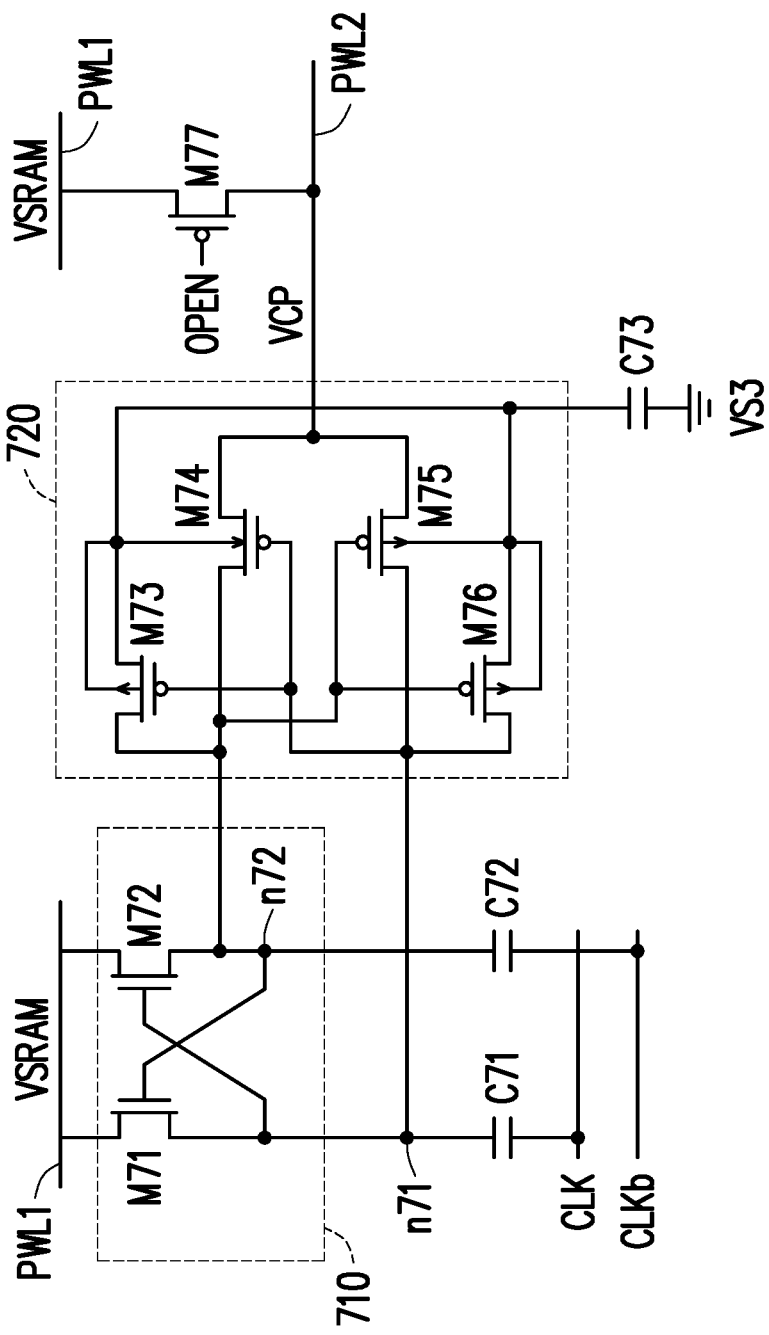

Referring to FIG. 5 to FIG. 7, FIG. 5 to FIG. 7 are schematic diagrams respectively illustrating different implementations of a boosting circuit in a memory device of the embodiment of the invention. In addition to the implementation of the voltage boosting circuit 110 shown in FIG. 2A, the voltage boosting circuit in the memory device of the embodiment of the invention can still be implemented by various other charge pump circuits. In FIG. 5, a voltage boosting circuit 500 includes a plurality of diodes formed by transistors M1 to Mn+1, capacitors C1 to Cn, and a switch constructed by a transistor M51. Among them, the diodes formed by the transistors M1 to Mn+1 are coupled in series with each other, and are coupled between the power voltage rail PWL1 and a voltage feed out point OE in a forward bias direction. First terminals of the capacitors C1 to Cn are respectively coupled to cathodes of the diodes formed by the transistors M1 to Mn, and second terminals of the capacitors C1 to Cn sequentially and alternately receive a clock signal CLK and a backward clock signal CLKb. In the sleep mode, the clock signal CLK and the complementary backward clock signal CLKb are activated, and a charge pump operation is performed through the capacitors C1 to Cn to perform the voltage boosting operation on the power voltage VSRAM and generate the boosting voltage VCP.

In addition, the transistor M51 is coupled between the voltage feed out point OE and the control voltage rail PWL2. In the sleep mode, the transistor M51 can be turned on according to a backward activation signal OPENb to transmit the boosting voltage VCP to the control voltage rail PWL2 as the control voltage VCtrl. In contrast, in the normal mode, the transistor M51 is cut-off (the formed switch is equivalently cut-off), and the control voltage rail PWL2 and the voltage feed out point OE are electrically isolated.

It should be noted that a transistor M52 forms a switch and is coupled between the control voltage rail PWL2 and the power voltage rail PWL1. The function of the transistor M52 is the same as that of the transistor M21 in FIG. 2, and will not be repeated here.

Incidentally, in this embodiment, whether the clock signal CLK and the complementary backward clock signal CLKb are activated can be determined according to the activation signal OPEN. When the activation signal OPEN is at logic high voltage, the clock signal CLK and the complementary backward clock signal CLKb can be activated (which are complementary periodic pulse signals respectively). In contrast, when the activation signal OPEN is at logic low voltage, the clock signal CLK and the complementary backward clock signal CLKb can be turned off (which are complementary DC signals respectively).

Referring to FIG. 6, a voltage boosting circuit 600 of FIG. 6 includes cross coupling transistor pairs 610 and 620 and capacitors $C_{CP1}$ and $C_{CP2}$. The cross coupling transistor pair 610 is coupled between the power voltage rail PWL1, a first node $n_0$ and a second node $n_1$. The cross coupling transistor pair 620 is coupled between the first node $n_0$, the second node $n_1$ and the control voltage rail PWL2. Conductivity types of the cross coupling transistor pairs 610 and 620 are complementary. The cross coupling transistor pair 610 includes P-type transistors MP61 and MP62. A control terminal of the transistor MP61 is coupled to a second terminal of the transistor MP62; a first terminal of the transistor MP61 is coupled to the control voltage rail PWL2; and a second terminal of the transistor MP61 is coupled to the first node $n_0$. A control terminal of the transistor MP62 is coupled to a second terminal of the transistor MP61; a first terminal of the transistor MP62 is coupled to the control voltage rail PWL2; and a second terminal of the transistor MP62 is coupled to the second node $n_1$. In addition, the cross coupling transistor pair 620 includes N-type transistors MN61 and MN62. A control terminal of the transistor MN61 is coupled to a second terminal of the transistor MN62; a first terminal of the transistor MN61 is coupled to the power voltage rail PWL1; and a second terminal of the transistor MN61 is coupled to the first node $n_0$. A control terminal of the transistor MN62 is coupled to a second terminal of the transistor MN61; a first terminal of the transistor MN62 is coupled to the power voltage rail PWL1; and a second terminal of the transistor MN62 is coupled to the second node $n_1$.

In this embodiment, the capacitors $C_{CP1}$ and $C_{CP2}$ are respectively coupled to the first node $n_0$ and the second node $n_1$, and respectively receive the complementary backward clock signal CLKb and the clock signal CLK. In the sleep mode, the clock signal CLK and the complementary backward clock signal CLKb are activated, and a charge pump operation is performed through the capacitors $C_{CP1}$ and $C_{CP2}$ to perform the voltage boosting operation on the power voltage VSRAM and generate the boosting voltage VCP. In this embodiment, the backward clock signal CLKb is generated through an inverter INV.

In this embodiment, whether the clock signal CLK and the complementary backward clock signal CLKb are activated can also be determined according to the activation signal OPEN. The decision mechanism is the same as that of the embodiment in FIG. 5, and is not repeated here.

Further, in this embodiment, a switch formed by a transistor MP63 is coupled between the control voltage rail PWL2 and the power voltage rail PWL1, and the transistor MP63 is cut-off or turned on according to the activation signal. The function of the transistor MP63 is the same as that of the transistor M21 in FIG. 2, and is not repeated here.

Referring to FIG. 7, a voltage boosting circuit 700 of FIG. 7 includes a cross coupling transistor pair 710, a transmission channel selector 720 and capacitors C71, C72 and C73. The cross coupling transistor pair 710 is coupled between the power voltage rail PWL1, a first node n71 and a second node n72. Two first terminals of the capacitors C71 and C72 are respectively coupled to the first node n71 and the second node n72, and two second terminals of the capacitors C71 and C72 respectively receive the complementary clock signal CLK and the backward clock signal CLKb. The transmission channel selector 720 is coupled to the first node n71 and the second node n72 and is coupled to the control voltage rail PWL2 and the capacitor C73. The capacitor C73 is also coupled to the reference ground terminal VSS.

The cross coupling transistor pair 710 includes transistors M71 and M72. The transistor M71 is coupled between the power voltage rail PWL1 and the first node n71, and has a control terminal coupled to the second node n72. The transistor M72 is coupled between the power voltage rail PWL1 and the second node n72, and has a control terminal coupled to the first node n71. The cross coupling transistor pair 710 may be configured to raise a voltage of the second node n72 or the first node n71 to the power voltage VSRAM according to the voltage of the first node n71 or the second node 72.

The transmission channel selector 720 includes transistors M73 to M76. Transistors M73 and M74 can form a first channel, and transistors M75 and M76 can form a second channel. The first channel is controlled by the voltage of the first node n71, and the second channel is controlled by the voltage of the second node n72. The first channel is connected to the capacitor C73, the control voltage track PWL2 and the first node n71; the second channel is connected to the capacitor C73, the control voltage track PWL2 and the second node n72.

According to the voltages of the first node n71 and the second node n72, the transmission channel selector 720 can select the first channel for transmitting the voltage of the first node n71 to the capacitor C73 and the control voltage rail PWL2 or the second channel for transmitting the voltage of the second node n72 to the capacitor C73 and the control voltage rail PWL2.

In this embodiment, in the sleep mode, the clock signal CLK and the complementary backward clock signal CLKb are activated, and a charge pump operation is performed through the capacitors C71, C72 and C73 to perform the voltage boosting operation on the power voltage VSRAM and generate the boosting voltage VCP.

In this embodiment, whether the clock signal CLK and the complementary backward clock signal CLKb are activated can also be determined according to the activation signal OPEN. The decision mechanism is the same as that of the embodiment in FIG. 5, and is not repeated here. Further, in this embodiment, a switch formed by a transistor MP77 is coupled between the control voltage rail PWL2 and the power voltage rail PWL1, and the transistor MP77 is cut-off or turned on according to the activation signal. The function of the transistor MP77 is the same as that of the transistor M21 in FIG. 2, and is not repeated here.

Figure 8:
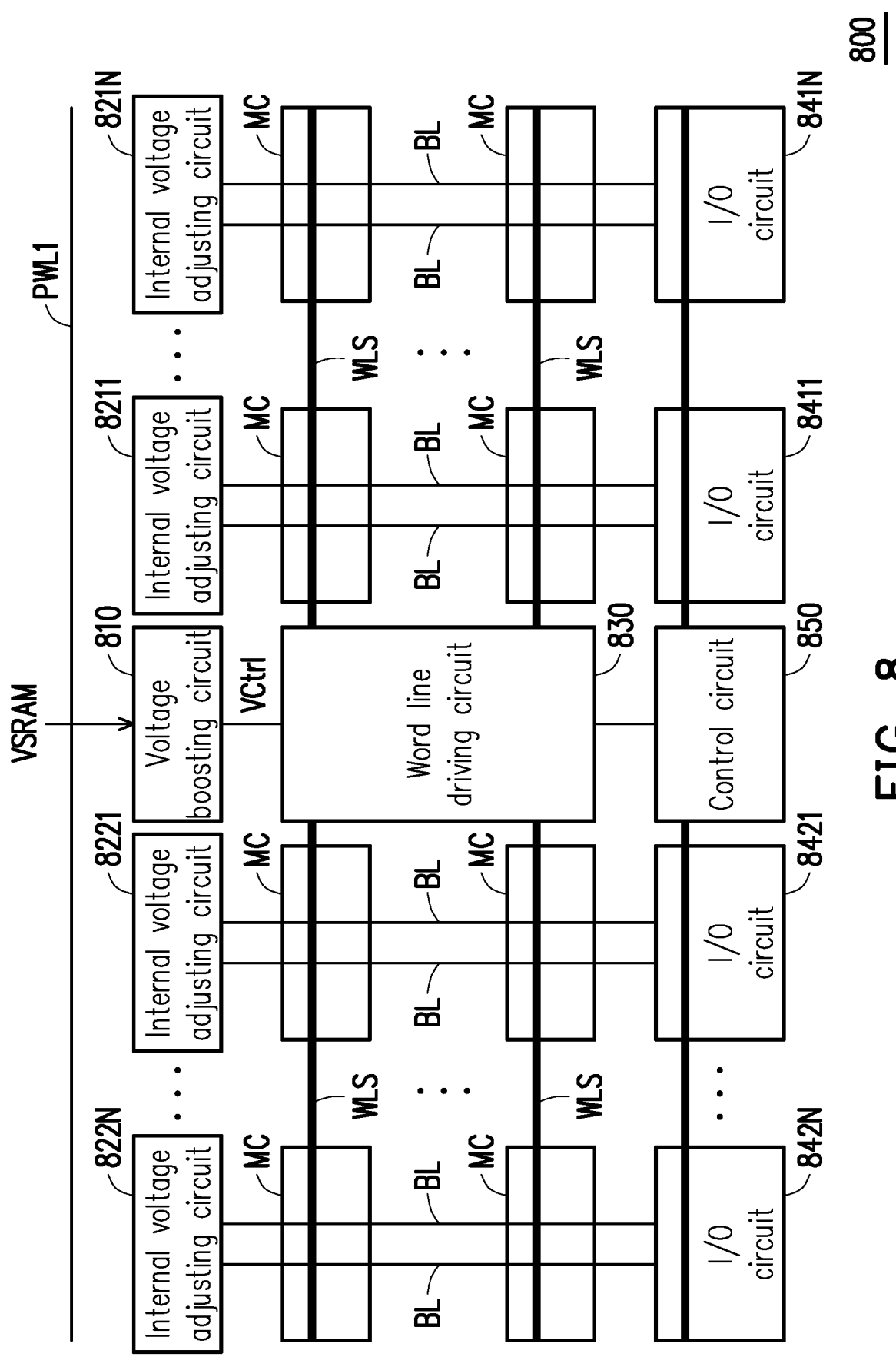
FIG. 8 is a schematic diagram illustrating a layout structure of a memory device according to an embodiment of the invention.

Referring to FIG. 8, FIG. 8 is a schematic diagram illustrating a layout structure of a memory device according to an embodiment of the invention. A memory device 800 includes a voltage boosting circuit 810, a plurality of internal voltage adjusting circuits 8211 to 821N and 8221 to 822N, a plurality of memory cell arrays MC, a word line driving circuit 830, a plurality of input output (I/O) circuits 8411 to 841N and 8421 to 842N and a control circuit 850. The voltage boosting circuit 810 and the internal voltage adjusting circuits 8211 to 821N and 8221 to 822N are coupled to the power voltage rail PWL1 and receive the single power supply voltage VSRAM.

The voltage boosting circuit 810 provides the control voltage VCtrl to the word line driving circuit 830 as an operating power source of the word line driving circuit 830. The word line driving circuit 830 can generate word line signals WLS based on the control voltage VCtrl. As implementation details, the voltage boosting circuit 810 can be constructed by applying any of the voltage boosting circuits 110, 500 to 700 of FIG. 2A and FIG. 5 to FIG. 7 of the invention.

In this embodiment, the internal voltage adjusting circuits 8211 to 821N and 8221 to 822N in this embodiment are plural in numbers, and can be respectively arranged on two opposite sides of the memory device 800. Among them, the internal voltage adjusting circuits 8211 to 821N are arranged on a first side of the memory device 800, and the internal voltage adjusting circuits 8221 to 822N are arranged on a second side of the memory device 800. The voltage boosting circuit 810 can be arranged in the middle of the first side and the second side. The internal voltage adjusting circuits 8211 to 821N and 8221 to 822N are respectively corresponding to the memory cell arrays MC on different rows, and configured to generate an operating power for the memory cell arrays MC. Each of the internal voltage adjusting circuits 8211 to 821N and 8221 to 822N can be implemented by applying the internal voltage adjusting circuit 340 or 400 in the embodiment of FIG. 3 or FIG. 4.

It is worth mentioning that the internal voltage adjusting circuits 8211 to 821N and 8221 to 822N in the embodiment of the invention may be multiple circuits independent of each other. In other words, the internal voltage adjusting circuits 8211 to 821N and the internal voltage adjusting circuits 8221 to 822N of the invention can operate in the same or different modes.

When the internal voltage adjusting circuits 8211 to 821N are operated in the deep sleep mode, the internal voltage adjusting circuits 8221 to 822N can be operated in the non-deep sleep mode. Alternatively, when the internal voltage adjusting circuits 8211 to 821N are operated in the non-deep sleep mode, the internal voltage adjusting circuits 8221 to 822N can be operated in the deep sleep mode. Alternatively, the internal voltage adjusting circuits 8211 to 821N, 8221 to 822N can be synchronously operated in the deep sleep mode or synchronously operated in the non-deep sleep mode.

The I/O circuits 8411 to 841N and 8421 to 842N are respectively coupled to bit lines BL of the memory cell arrays MC, and perform data transmission operations during access operations. The I/O circuits 8411 to 841N and 8421 to 842N can be respectively disposed on two opposite sides of the control circuit 850.

In this embodiment of the invention, the memory cell arrays MC are static random access memory cell arrays.

In summary, in the memory device of the invention, the single power supply voltage in the memory device is received through the voltage boosting circuit. In the sleep mode, the voltage boosting operation is performed on the power voltage to generate the control voltage. The control voltage is used to provide a basis for generating the word line signals. In this way, the memory device can maintain normal access operations in the sleep mode, and achieve the effect of being operable under low power.

The invention claimed is:

1. A memory device, comprising:
   a voltage boosting circuit coupled to a power voltage rail, the voltage boosting circuit being activated in a sleep mode to, based on an activation signal, perform a voltage boosting operation on a power voltage of the power voltage rail to generate a boosting voltage and transmit the boosting voltage to a control voltage rail;
   a switching circuit coupled between the power voltage rail and the control voltage rail and turned on or cut-off according to a first mode selection signal; and
   a word line driving circuit coupled to the control voltage rail, the word line driving circuit generating a plurality of word line signals according to the boosting voltage in the sleep mode and generating the word line signals according to the power voltage in a normal mode.

2. The memory device of claim 1, wherein the voltage boosting circuit comprises:
   a capacitor having a first terminal coupled to the control voltage rail;
   a buffer having an input terminal receiving the activation signal, an output terminal of the buffer being coupled to a second terminal of the capacitor; and
   a switch coupled between the control voltage rail and the power voltage rail and turned on or cut-off according to the activation signal,
   wherein the activation signal is a pulse signal in the sleep mode.

3. The memory device of claim 1, wherein the voltage boosting circuit comprises:
   a plurality of diodes coupled in series between the power voltage rail and a voltage feed out point in a forward bias direction; and
   a plurality of capacitors respectively having a plurality of first terminals respectively coupled to cathodes of the diodes, a plurality of second terminals of the capacitors sequentially and alternately receiving a clock signal and a backward clock signal; and
   a switch coupled between the voltage feed out point and the control voltage rail and turned on or cut-off according to a backward activation signal.

4. The memory device of claim 1, wherein the voltage boosting circuit comprises:
   a cross coupling transistor pair configured to raise a voltage of a first node or a second node to the power voltage according to the voltage of the first node or the second node;
   a first capacitor having a first terminal coupled to the first node, a second terminal of the first capacitor receiving a clock signal;
   a second capacitor having a first terminal coupled to the second node, a second terminal of the second capacitor receiving a backward clock signal;
   a transmission channel selector, according to the voltages of the first node and the second node, selecting a first channel for transmitting the voltage of the first node to the control voltage rail or a second channel for transmitting the voltage of the second node to the control voltage rail; and
   a third capacitor coupled between the control voltage rail and a reference ground terminal.

5. The memory device of claim 1, wherein the voltage boosting circuit comprises:
- a first cross coupling transistor pair coupled between the power voltage rail, a first node and a second node;
- a second cross coupling transistor pair coupled between the control voltage rail, the first node and the second node;
- a first capacitor having a first terminal coupled to the first node, a second terminal of the first capacitor receiving a clock signal;
- a second capacitor having a first terminal coupled to the second node, a second terminal of the second capacitor receiving a backward clock signal,
- wherein conductivity types of the first cross coupling transistor pair and the second cross coupling transistor pair are complementary.

6. The memory device of claim 1, further comprising:
an internal voltage adjusting circuit coupled between the power voltage rail and an internal voltage rail and selecting whether to reduce the power voltage to generate an internal voltage according to a second mode selection signal, wherein the internal voltage is configured to be provided to a memory cell array in the memory device.

7. The memory device of claim 6, wherein the internal voltage adjusting circuit comprises:
- a first transistor having a first terminal coupled to the power voltage rail, a second terminal of the first transistor being coupled to the internal voltage rail, a control terminal of the first transistor receiving the second mode selection signal; and
- a second capacitor coupled in parallel with the first transistor, wherein conductivity types of the first transistor and the second transistor are complementary.

8. The memory device of claim 6, wherein the internal voltage adjusting circuit comprises:
- a first transistor having a first terminal coupled to the power voltage rail, a second terminal of the first transistor coupled to the internal voltage rail, a control terminal of the first transistor receiving the second mode selection signal, wherein the first transistor is a P-type transistor; and
- a diode string coupled in series between the power voltage rail and the internal voltage rail in a forward bias direction; and
- a switch coupled to a coupling path between the diode string and the internal voltage rail and turned on or cut-off according to a third mode selection signal.

9. The memory device of claim 8, wherein the internal voltage adjusting circuit further comprises:
- a second capacitor coupled in parallel with the first transistor, wherein the second transistor is an N-type transistor.

10. The memory device of claim 1, wherein the word line driving circuit comprises:
- a first buffer using the power voltage as an operating power for generating a first signal according to a word line control signal being received;
- a second buffer using a control voltage of the control voltage rail as an operating power for receiving the first signal to generate a second signal;
- a third buffer using the control voltage of the control voltage rail as an operating power for receiving the second signal to generate each of the word line signals; and
- a pull-up circuit coupled between an output terminal of the second buffer and the control voltage rail and pulling up the second signal according to each of the word line signals.

* * * * *